(12) United States Patent
Herberholz

(10) Patent No.: US 10,571,939 B2
(45) Date of Patent: Feb. 25, 2020

(54) CONFIGURATION OF VOLTAGE REGULATION CIRCUITRY

(71) Applicant: ARM Limited, Cambridge (GB)

(72) Inventor: Rainer Herberholz, Great Abington (GB)

(73) Assignee: ARM Limited, Cambridge (GB)

( * ) Notice: Subject to any disclaimer, the term of this patent is extended or adjusted under 35 U.S.C. 154(b) by 86 days.

(21) Appl. No.: 15/721,509

(22) Filed: Sep. 29, 2017

(65) Prior Publication Data

US 2019/0101946 A1   Apr. 4, 2019

(51) Int. Cl.
*G05F 1/46* (2006.01)
*G05F 3/20* (2006.01)
*H01L 27/02* (2006.01)

(52) U.S. Cl.
CPC ............. *G05F 1/465* (2013.01); *G05F 3/205* (2013.01); *H01L 27/0222* (2013.01)

(58) Field of Classification Search
CPC .......... G05F 1/595; G05F 1/465; G05F 3/205; H01L 27/0222
See application file for complete search history.

(56) References Cited

U.S. PATENT DOCUMENTS

| | | | |
|---|---|---|---|
| 7,123,076 B2* | 10/2006 | Hatakeyama | H03K 19/0016 327/534 |
| 7,812,662 B2* | 10/2010 | Lundberg | G05F 3/205 327/534 |
| 7,816,974 B2* | 10/2010 | Araki | G05F 3/205 327/534 |
| 9,667,138 B2* | 5/2017 | Chen | H02M 3/08 |
| 2015/0270367 A1* | 9/2015 | Vigar | H01L 21/2658 438/301 |

OTHER PUBLICATIONS

Srinivasan, et al.; "Body-Bias Scaling for Globalfoundries 22FDx Technology New Dimension to Explore the Design" SNUG Silicon Valley 2016; Globalfoundries; Mar. 30, 2016.

* cited by examiner

*Primary Examiner* — Patrick O Neill
(74) *Attorney, Agent, or Firm* — Pramudji Law Group PLLC; Ari Pramudji

(57) ABSTRACT

Various implementations described herein are directed to an integrated circuit. The integrated circuit may include core circuitry connected between a high voltage source and a low voltage source. The core circuitry may include multiple transistors including a first transistor of a first polarity type and a second transistor of a second polarity type that is different than the first polarity type. The integrated circuit may include voltage regulation circuitry connected between an external positive voltage source and ground. The voltage regulation circuitry may operate to provide the low voltage source to the core circuitry. The low voltage source may be equal to or higher than ground. The voltage regulation circuitry may further operate to body bias the multiple transistors with a single voltage that is applied to a body terminal of the first transistor and the second transistor.

20 Claims, 3 Drawing Sheets

CONFIGURATION OF VOLTAGE REGULATION CIRCUITRY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Generally, back-gating is a particular device feature in fully depleted silicon on insulator (FD-SOI) over Fin-Fet technology that allows adjusting the threshold voltage for the front-gate. Standard chip architecture places voltage regulation on a high-side to thereby generate VDD for some core power domains with a common low-side VSS=GND. Certain FD-SOI technologies define VSS as the common reference potential for the back-gates of N- and P-MOS. To use back-gating, biasing potentials need to be generated and the associated power consumption has to be considered. As a consequence, reverse body-biasing of NMOS devices or forward body-biasing of PMOS devices require the generation of negative voltages, typically by charge pumping. This can have multiple drawbacks including, in one example, charge pumps are clocked circuits and cause considerable power and chip-area overhead, while modifications lowering their power consumption typically degrade the quality of the supplies generated (increased ripple).

Further, in bulk CMOS designs, the threshold voltage increases as the supply voltage reduces due to drain-induced barrier lowering (DIBL). This can be detrimental to circuit performance; however, the drive-strength ratio between P-N can be approximately maintained by trading off the differences in DIBL against the set-point of the threshold voltages at nominal (VDD-VSS). While DIBL is detrimental to performance, maintaining the drive-strength ratio is important to guarantee the operation of logic circuits over a large range of supply voltages (VDD-VSS). By contrast, FD-SOI technologies show reduced DIBL, yet using VSS as common reference potential for the back-gate exposes only the PMOS to a change in the back-gate potential as the supply voltage VDD is varied. Consequently such FD-SOI technologies do not preserve the ratio of between P-N drive-strength over a large range of supply voltages, compromising the function of logic circuits. As such, there exists a need to improve the configuration for voltage regulation in FD-SOI technology using VSS as a common reference for the back-gate of N- and P-MOS so as to improve the ability of circuits to operate over an extended range of supply voltages with low power consumption.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to and are directed to the configuration of voltage regulation circuitry for logic and memory circuit applications to utilize low-side supply voltage regulation. For instance, the voltage regulation circuitry may utilize a low-side regulator configuration for low-voltage FD-SOI device designs that may maintain an NMOS/PMOS drive strength ratio without the need for charge pumps and negative supply rails. Various implementations described herein refer to a voltage regulator configuration that supplies core logic and/or memory in certain FD-SOI technologies, where a reference back-gate voltage at nominal supply is VSS for both, NMOS and PMOS devices. In such a configuration, voltage regulation moves from a high-side (i.e., generate VDD) to a low-side (i.e., generate VSS). As a result, a back-gate potential VBS may be adjusted for both, NMOS and PMOS without charge pumps to maintain P/N drive strength over a wide range of supply voltages (VDD-VSS).

Various implementations of core circuitry and associated power management along with voltage regulation circuitry for logic and memory applications will now be described in greater detail herein with reference to FIGS. 1-3.

Figure 1:
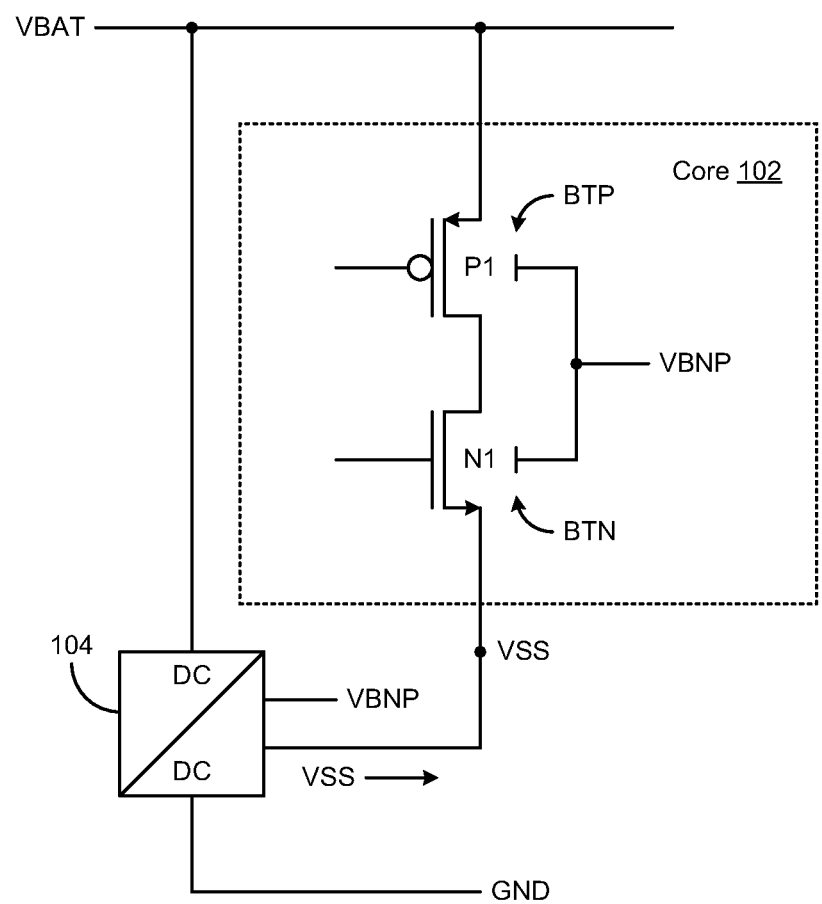
FIG. 1 illustrates a diagram of voltage regulation circuitry configured in accordance with various implementations described herein. The DC/DC block may include multiple voltage regulators.

FIG. 1 illustrates a schematic block diagram in accordance with various implementations described herein. As shown, the block diagram may include core circuitry and associated power management 100, such as, e.g., core circuitry 102 and a voltage regulation circuitry 104 that may be implemented as an integrated circuit (IC). The core circuitry may comprise various types of logic and low power memory applications, such as, e.g., static random access memory (SRAM), and/or any other types of memory capable of operating at the same voltage supply as the logic circuit (single rail), including types of volatile and non-volatile memory. In some cases, the core circuitry and associated power management 100 may be implemented as an IC with single or dual rail memory architecture. In some other cases, the core circuitry and associated power management 100 may be integrated with various types of computing circuitry and/or various related components on a single chip. Further, the core circuitry and associated power management 100 may be implemented in an embedded system for various electronic and mobile applications.

The core circuitry 102 is powered between a high supply voltage pin VDD, and a low supply voltage pin VSS. The core circuitry 102 may have multiple transistors including a first transistor P1 of a first polarity (e.g., p-type) and a second transistor N1 of a second polarity (e.g., n-type) that is different than the first type. The supply voltage of the core circuitry is (VDD-VSS). As shown, VDD of the core circuitry 102 may be connected directly to the external positive voltage source VBAT or, in some cases, a solar cell or other form of power harvesting. The low supply (VSS) of the core circuitry 102 may be connected directly to the power output pin of the voltage regulator 104.

The block diagram includes the voltage regulation circuitry 104 which is connected between the external positive voltage source VBAT and ground potential GND. In some cases, VBAT may be provided by a battery and/or a solar cell or other form of power harvesting. The voltage regulation circuitry 104 may operate to provide the low voltage source VSS to the core circuitry 102, whereby GND≤VSS≤VBAT and GND≤VSS≤VDD. The voltage regulation circuitry 104 may further operate to body bias the multiple transistors P1, N1 with a single voltage signal VBNP that is applied to a body terminal BTP of the first transistor P1 and a body terminal BTN of the second transistor N1. As shown, the first transistor P1 may be a p-type metal-oxide-semiconductor (PMOS) transistor, and the second transistor N1 may be an n-type metal-oxide-semiconductor (NMOS) transistor. Further, as an example of a logic gate, the first and second transistors P1, N1 may be connected in a stack that may be configured as an inverter, such that the first transistor P1 is coupled between the positive voltage source VBAT and the second transistor N1 and such that the second transistor N1 is coupled between the first transistor P1 and the voltage regulator 104 so as to receive the low voltage source VSS.

The voltage regulator 104 may operate to regulate the low voltage source VSS instead of the high supply pin VDD. Further, in some cases, the voltage regulator 104 may be implemented as a switched DC-DC voltage regulator that operates to generate the low voltage source VSS with low power losses. In various implementations, the voltage regulator 104 may supply one or more voltages, including one or more different voltages. The circuitry 100 shown in the block diagram of FIG. 1 may include multiple voltage regulators of one or more types and/or different types. In some cases, the voltage regulator 104 may be referred to as a power management unit (PMU).

The single voltage signal VBNP may be associated with a back-gate potential voltage signal VBNP that is generated by the voltage regulator 104 and applied to the first transistor P1 and the second transistor N1 using the body terminals BTP, BTN thereof, respectively, as a common back-bias connection. Since the DC current load on VBNP is small in comparison to VSS, the circuitry used to generate VBNP may be simple and have low power conversion efficiency. One example is to use a low dropout regulator (LDO).

In some implementations, the low voltage source VSS may be associated with a low core voltage supply VSS that is generated by the voltage regulator 104. The low core voltage supply VSS may be greater than the ground voltage supply GND. The low core voltage supply VSS may be between the positive battery voltage supply VBAT and the ground voltage supply GND.

In some implementations, the positive voltage source VBAT may be associated with a high core voltage supply pin VDD. The positive voltage source VBAT may be associated with an external voltage supply VBAT that is greater than or equal to the high core voltage supply VDD. The ground potential GND defined as having zero voltage (i.e., 0 volts). In some cases, VBAT may be provided by a battery and/or a solar cell or other form of energy harvesting.

Various implementations described herein refer to and are directed to the improved configuration of voltage regulation circuitry, methods, and techniques that provide for back-gating without charge-pumping. With certain fully depleted silicon on insulator (FD-SOI) transistors, back-gates of both NMOS and PMOS transistors may use VSS as a default potential. In such cases, it may be advantageous to decouple VSS from GND. For instance, to achieve this with minimum power overhead, the voltage regulation circuitry may be adapted to move to the low-side of the core, while using VDD=VBAT (i.e., connect high-side direct to VBAT). In this case, DC-DC voltage conversion may be used to generate VSS rather than VDD.

In some implementations, since FD-SOI NMOS and PMOS devices may have a same nominal back-gate potential, a common connection may be utilized to correct a skewed N/P ratio using a common back-bias between GND and VBAT. For instance, a common connection on the NMOS and PMOS back-gates (VBNP) may be applied to the NMOS and PMOS devices with flip-well and/or conventional wells, while inhibiting or minimizing overhead. In some scenarios, a particular use case may refer to applying this configuration to SRAM instances, where stability as well as the ability to read and write critically depends on a ratio of drive strengths between NMOS and PMOS devices.

For FD-SOI, a default back-gate connection to VSS at nominal supply voltage (VDD-VSS) will result in systematically changing the N/P drive strength ratio when (VDD-VSS) varies. While NMOS VBS remains at Zero, PMOS VBS is −VDD. Hence, as (VDD-VSS) reduces, forward body bias for PMOS decreases also, and consequently, the threshold voltage increases. Since the DIBL effect is much weaker in FD-SOI versus bulk due to an improved electrostatic control of the channel, there is no simple way to keep the N/P balance other than generating a back-bias VBTN<GND for NMOS transistors over P-Well (regular well) to slow down NMOS at the same rate as PMOS or generating a back-bias VBTP<GND for PMOS transistors over P-Well (flip well) to maintain the VBS of the PMOS. For a back-gate sensitivity on an order of about ~100 mV/V, this may cause about ½ an order of magnitude of shift in P/N drive strength ratio moving from strong to weak inversion between (VDD-VSS)=0.7V to (VDD-VSS=0.4V). This substantially reduces or limits the ability to use standard cells and memory to function over a large range of (VDD-VSS) in certain FD-SOI technologies.

With a standard high-side supply configuration, there is little scope to moderate this without generating additional voltages outside of GND and/or VDD, which typically requires substantial power and area overhead. It may therefore be advantageous to decouple the default back-gate potential VSS from GND and use a potential between VBAT and GND in so as to allow VSS to move up or down without the need for clocked circuitry with high power consumption overheads such as charge pumps. To achieve this with minimum power overhead, the voltage regulation may be moved to the low-side of the core, while using VDD=VBAT (e.g., connect high-side of the core directly to VBAT). In this case, DC/DC conversion may be used to generate VSS rather than VDD, which is feasible, in a manner as described herein.

As the default back-gate potential is common for NMOS and PMOS at nominal voltage, a common generator for the back-gate potential with GND VBNP VBAT may be used. Any change to VBNP affects the drive strength of NMOS and PMOS in an opposite direction and may thus be used to dynamically adjust the P/N drive strength ratio across a wide range of supply voltages (VDD-VSS). This approach may apply similarly or equally to devices with flip-wells and conventional wells.

For instance, a particular use case may refer to applying this scheme to SRAM arrays, where cell stability as well as the ability to read and write critically depends on the ratio of threshold voltages and drive strengths between NMOS and PMOS devices. With the above configuration, a proposed method of mitigating for different (VDD-VSS) as well as compensating for process and temperature variation is as follows. First, start-up on the design value of the low core supply VSS_nom. Next, run a delay monitor (e.g., a ring-oscillator with balanced dependency on NMOS and PMOS gate delays) and tune VSS to obtain the target frequency. Next, run a pair of process monitors depending on either NMOS or PMOS, such as, e.g., ring-oscillators, and tune the back-gate potential VBNP to obtain a target frequency ratio. At this stage, the circuit may be running near typical performance. If boost operation is desired, the well potentials may be modified relative to this calibrated operation point by pulling the N- and P-back-gate potentials apart. Further aspects related to this calibration method is further described herein below in FIG. 3.

Figure 2:
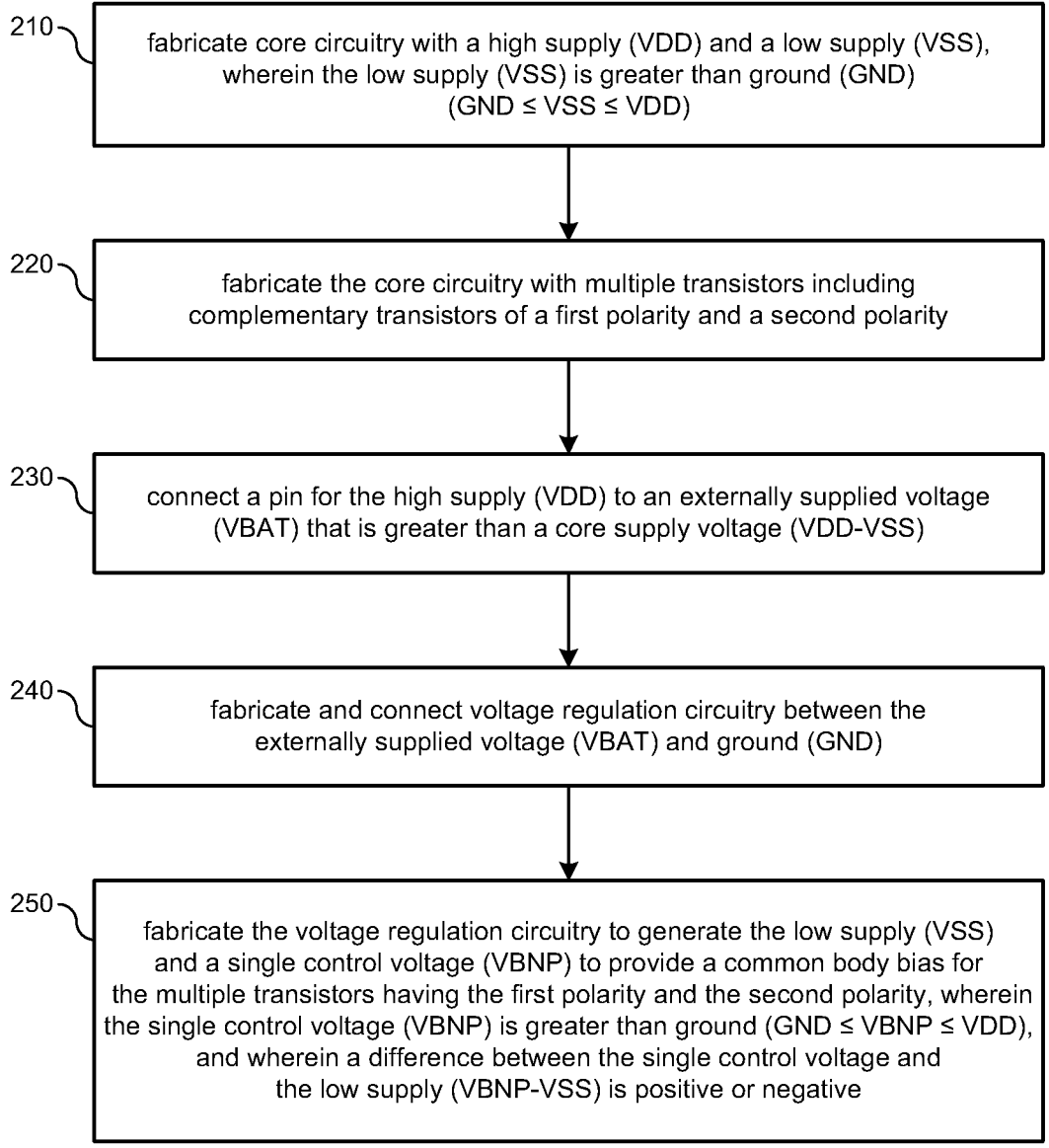
FIG. 2 illustrates a method of fabricating an integrated circuit in accordance with various implementations described herein.

FIG. 2 illustrates a design implementation flow diagram of a method 200 for fabricating an integrated circuit in accordance with various implementations described herein.

It should be understood that even though method 200 may indicate a particular order of design execution, in some cases, various certain steps may be executed in a different order, and on different systems. In other cases, additional operations and/or steps may be added to and/or omitted from method 200.

As described and shown in reference to FIG. 2, method 200 may be utilized for manufacturing an integrated circuit (IC) that implements voltage regulation circuitry in various types of logic and memory applications.

At block 210, method 200 may fabricate core circuitry with a high supply (VDD) and a low supply (VSS), and the high supply (VDD) is greater than the low supply (VSS), and the low supply (VSS) is greater than ground (GND) such that (GND≤VSS≤VDD). At block 220, method 200 may fabricate the core circuitry with multiple transistors including complementary transistors of a first polarity and a second polarity. The complementary transistors may include first and second transistors that are connected within a core area of the integrated circuit to form a logic and/or memory circuit design. For illustration, logic gates or memory circuits may be schematically represented by the first and second transistors coupled together in a stack such that a source terminal of the first transistor is connected to the high core voltage supply pin (VDD), the drains of the first and second transistors are connected together, and such that the source terminal of the second transistor is connected between the first transistor and the low core voltage supply pin (VSS). The first transistor may be a PMOS transistor, and the second transistor may be an NMOS transistor.

At block 230, method 200 may connect a pin for the high supply (VDD) to an externally supplied voltage (VBAT) that is greater than a core supply voltage (VDD-VSS). At block 240, method 200 may fabricate and connect voltage regulation circuitry between the externally sullied voltage (VBAT) and ground (GND). At block 250, method 200 may fabricate the voltage regulating circuitry to generate the low supply (VSS) and a single control voltage (VBNP) to provide a common body bias for the multiple transistors having the first polarity and the second polarity. The single control voltage (VBNP) is greater than ground (GND) such that (GND≤VBNP≤VDD) and a difference between the single control voltage (VBNP) and the low supply (VSS), i.e., (VBNP–VSS), is positive or negative. The voltage regulation circuitry may generate the low core voltage supply (VSS) instead of the high core voltage supply (VDD). The voltage regulation circuitry may include a switched DC-DC voltage regulator. The voltage regulation circuitry may include a low drop-out regulator (LDO) that generates the back-gate potential VBNP.

In various implementations, a voltage regulator may supply one or more voltages. The circuitry 100 shown in the block diagram of FIG. 1 may include multiple regulators of one or more types and/or different types. In some cases, the voltage regulator may be referred to as a power management unit (PMU).

In some implementations, the high core voltage supply (VDD) may be equal to the external voltage supply (VBAT). The ground potential (GND) may refer to zero potential. The low core voltage supply (VSS) may be greater than the ground voltage supply (GND). The low core voltage supply (VSS) may be between the external voltage supply (VBAT) and the ground voltage supply (GND). In some cases, VBAT may be provided by a battery and/or a solar cell.

Figure 3:
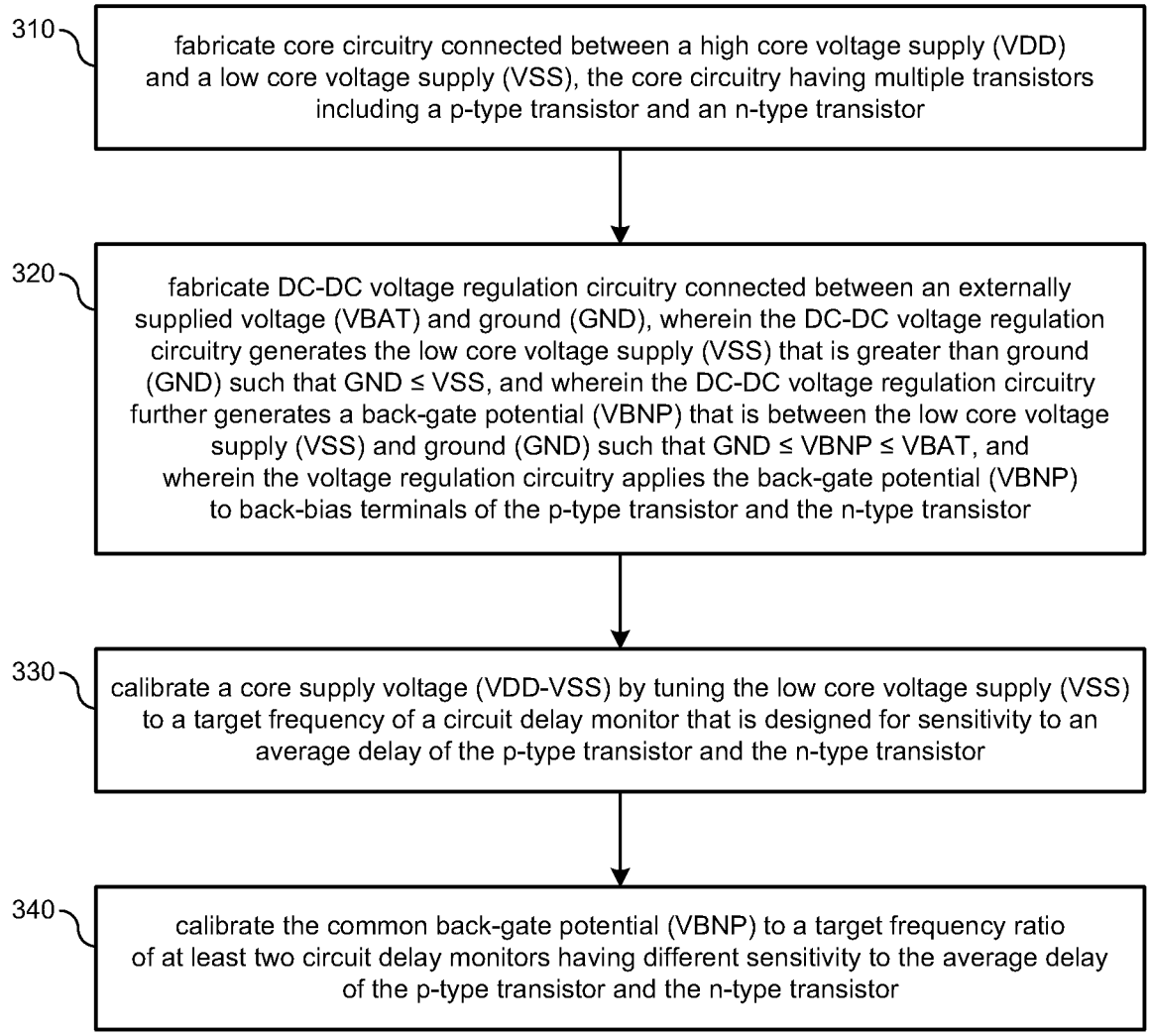
FIG. 3 illustrates a method of fabricating and calibrating an integrated circuit in accordance with various implementations described herein.

FIG. 3 illustrates a process flow diagram of a method 300 of fabricating and calibrating an integrated circuit in accordance with various implementations described herein.

It should be understood that even though method 300 may indicate a particular sequence, in some cases, various certain portions of the operations may be executed in a different order, and on different systems. In other cases, additional operations and/or steps may be added to and/or omitted from method 300. Calibration steps described as part of method 300 may be implemented in hardware and/or software. If implemented in hardware, the method 300 may be implemented with various circuit components, such as described herein above in reference to FIG. 1. Where calibration is implemented in software, method 300 may be implemented as a program or software instruction process that may be configured for the voltage regulation circuitry as described herein. Further, if implemented in software, instructions related to implementing the method 300 may be stored in memory and/or a database. For instance, a computer or various other types of computing devices having a processor and memory may be configured to perform method 300.

As described and shown in reference to FIG. 3, method 300 may be utilized for manufacturing an integrated circuit (IC) that implements voltage regulation circuitry in various types of logic and memory applications.

At block 310, method 300 may fabricate core circuitry connected between a high core voltage supply (VDD) and a low core voltage supply (VSS), and the core circuitry may have multiple transistors including a p-type transistor and an n-type transistor. The p-type transistor may include a PMOS transistor, and the n-type transistor may include an NMOS transistor.

The core circuitry VDD pin may be connected directly to the external positive voltage supply (VBAT), and VSS pin may be connected directly to the DC-DC voltage regulator so as to receive the low core voltage supply (VSS) directly from the DC-DC voltage regulator. For illustration, logic gates or memory circuits may be schematically represented by the first and second transistors coupled together in a stack such that a source terminal of the first transistor is connected to the high core voltage supply pin (VDD), the drains of the first and second transistors are connected together and such that the source terminal of the second transistor is connected between the first transistor and the low core voltage supply pin (VSS). The first transistor may be a PMOS transistor, and the second transistor may be an NMOS transistor. The p-type transistor and the n-type transistor may be Silicon-On-Insulator (SOI) transistors having a default back-gate to source potential VBS of the p-type transistor that is (VSS-VDD). At block 320, method 300 may fabricate DC-DC voltage regulation circuitry connected between an externally supplied voltage (VBAT) and ground (GND). The DC-DC voltage regulation circuitry may generate the low core voltage supply (VSS) that is greater than ground (GND) such that GND VSS. The DC-DC voltage regulation circuitry may further generate a back-gate potential (VBNP)

that is between the low core voltage supply (VSS) and ground (GND) such that GND≤VBNP≤VBAT. The voltage regulation circuitry may apply the back-gate potential voltage (VBNP) to back-bias terminals of the p-type transistor and the n-type transistor. The DC-DC voltage regulation circuitry may operate to regulate the low core voltage supply (VSS) instead of the high core voltage supply (VDD). In some implementations, the external voltage supply (VBAT) may be greater than or equal to the high core voltage supply (VDD). Ground (GND) may be defined as zero potential. In some cases, VBAT may be provided by a battery and/or a solar cell or other form of energy harvesting.

At block 330, method 300 may calibrate a core supply voltage (VDD-VSS) by tuning the low core voltage supply (VSS) to a target frequency of a circuit delay monitor that is designed for sensitivity to an average switching delay of the p-type transistor and the n-type transistor. At block 340, method 300 may calibrate the common back-gate potential (VBNP) to a target frequency ratio of at least two circuit delay monitors having different sensitivity to the average delay of the p-type transistor and the n-type transistor.

In some implementations, the core circuitry may be connected directly to the high core voltage supply (VDD), and the core circuitry may be connected directly to the DC-DC voltage regulation circuitry so as to receive the low core voltage supply (VSS) directly from the DC-DC voltage regulation circuitry. The DC-DC voltage regulation circuitry may regulate the low core voltage supply (VSS) instead of the high core voltage supply (VDD).

In some implementations, in reference to the circuit delay monitor and the average delay, the delay is the time difference between applying an input to registering the associated output of a logic circuit. When considering the possible transitions when a logic output of a CMOS circuit switches, there may be two possibilities:

0→1 is achieved by a PMOS pulling the output potential to VDD, and

1→0 is achieved by an NMOS pulling the output potential to VSS.

To monitor the switching delays, a ring oscillator is used, in which an uneven number of logic gates that invert their input signal are connected into a ring and passing a transition through this ring. The delay may be measured on-chip by enabling the ring and counting the number of passes with a digital counter that is enabled for a set number of clock periods. Since the ring has a same number of 0→1 and 1→0 transitions, the result is an average of the specific properties of NMOS and PMOS. In some cases, logic gates may be designed to balance both delays closely as otherwise computation times become data-dependent. Further, it may be possible to deliberately skew a design to form cells that have highly asymmetric times for 0→1 versus 1→0 transitions, and such cells may be used to measure NMOS and PMOS skews individually.

Described herein are various implementations of an integrated circuit. The integrated circuit may include core circuitry connected between a high voltage source having a first potential and a low voltage source having a second potential that is less than the first potential. The core circuitry may include multiple transistors including a first transistor of a first polarity type and a second transistor of a second polarity type that is different than the first polarity type. The integrated circuit may include voltage regulation circuitry connected between an external positive voltage source and ground. The voltage regulation circuitry may operate to provide the low voltage source to the core circuitry. The low voltage source may be equal to or higher than ground. The voltage regulation circuitry may further operate to body bias the multiple transistors with a single voltage that is applied to a body terminal of the first transistor and the second transistor.

Described herein are various implementations of a method for manufacturing an integrated circuit. The method may include fabricating core circuitry that is connected between a high core voltage supply (VDD) and a low core voltage supply (VSS). The core circuitry may include multiple transistors including a p-type transistor and an n-type transistor. The method may include fabricating DC-DC voltage regulation circuitry that is connected between an externally supplied voltage (VBAT) and ground (GND). The DC-DC voltage regulation circuitry may generate the low core voltage supply (VSS) that is greater than ground (GND). The DC-DC voltage regulation circuitry may further generate a back-gate potential (VBNP) that is between the low core voltage supply (VSS) and ground (GND). The voltage regulation circuitry may apply the back-gate potential voltage (VBNP) to back-bias terminals of the p-type transistor and the n-type transistor. The method may include calibrating a core supply voltage (VDD-VSS) by tuning the low core voltage supply (VSS) to a target frequency of a circuit delay monitor that is designed for sensitivity to an average delay of the p-type transistor and the n-type transistor. The method may include calibrating the common back-gate potential (VBNP) to a target frequency ratio of at least two circuit delay monitors having different sensitivity to the average delay of the p-type transistor and the n-type transistor.

Described herein are various implementations of a method for manufacturing an integrated circuit. The method may include fabricating core circuitry with a high supply (VDD) and a low supply (VSS). The high supply (VDD) may be greater than the low supply (VSS), and the low supply (VSS) may be greater than ground (GND). The method may include fabricating the core circuitry with multiple transistors including complementary transistors of a first polarity and a second polarity. The method may include connecting a pin for the high supply (VDD) to an externally supplied voltage (VBAT) that is greater than a core supply voltage (VDD-VSS). The method may include fabricating and connecting voltage regulation circuitry between the externally supplied voltage (VBAT) and ground (GND). The method may include fabricating the voltage regulating circuitry to generate the low supply (VSS) and a single control voltage (VBNP) to provide a common body bias for the multiple transistors having the first polarity and the second polarity. The single control voltage (VBNP) may be greater than ground (GND) such that (GND≤VBNP≤VDD), and a difference between the single control voltage (VBNP) and the low supply (VSS), i.e., (VBNP−VSS), is positive or negative.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   core circuitry connected between a high voltage source having a first potential and a low voltage source having a second potential that is less than the first potential, the core circuitry having multiple transistors including a first transistor of a first polarity type and a second transistor of a second polarity type that is different than the first polarity type; and
   voltage regulation circuitry connected between an external positive voltage source and ground, wherein the voltage regulation circuitry operates to provide the low voltage source to the core circuitry, and wherein the low voltage source is equal to or higher than ground, and wherein the voltage regulation circuitry further operates to body bias the multiple transistors with a single voltage that is applied to a body terminal of the first transistor and the second transistor.

2. The integrated circuit of claim 1,
   wherein the core circuitry is connected directly to the external positive voltage source, and
   wherein the core circuitry is connected directly to the voltage regulation circuitry so as to receive the low voltage source directly from the voltage regulation circuitry.

3. The integrated circuit of claim 1, wherein the positive voltage source comprises a positive core voltage supply (VDD) having the first potential.

4. The integrated circuit of claim 3, wherein the high voltage source is equal to an externally provided positive supply voltage (VBAT).

5. The integrated circuit of claim 4, wherein ground (GND) refers to zero potential.

6. The integrated circuit of claim 5, wherein the low voltage source comprises a low core voltage supply (VSS) having the second potential that is generated by the voltage regulation circuitry, and wherein the low core voltage supply (VSS) is greater than the ground potential (GND), and wherein the low core voltage supply (VSS) is between the positive external voltage supply (VBAT) and the ground potential (GND).

7. The integrated circuit of claim 1, wherein the single voltage signal comprises a back-gate potential voltage signal (VBNP) that is generated by the voltage regulation circuitry and applied to the first transistor and the second transistor using the body terminals thereof as a common back-bias connection.

8. The integrated circuit of claim 7, wherein the voltage regulation circuitry comprises a linear low dropout regulator (LDO) to generate the back-gate potential voltage signal (VBNP).

9. The integrated circuit of claim 1, wherein the first transistor comprises a p-type metal-oxide-semiconductor (PMOS) transistor and the second transistor comprises an n-type metal-oxide-semiconductor (NMOS) transistor.

10. The integrated circuit of claim 1, wherein the voltage regulation circuitry operates to regulate the low voltage source instead of the high voltage source.

11. The integrated circuit of claim 1, wherein the voltage regulation circuitry comprises a switched DC-DC voltage regulator that operates to generate the low voltage source instead of the high voltage source.

12. A method, comprising:
   fabricating core circuitry connected between a high core voltage supply (VDD) and a low core voltage supply (VSS), the core circuitry having multiple transistors including a p-type transistor and an n-type transistor;
   fabricating DC-DC voltage regulation circuitry connected between an externally supplied voltage (VBAT) and ground (GND), wherein the DC-DC voltage regulation circuitry generates the low core voltage supply (VSS)

that is greater than ground (GND), and wherein the DC-DC voltage regulation circuitry further generates a back-gate potential (VBNP) that is between the low core voltage supply (VSS) and ground (GND), and wherein the voltage regulation circuitry applies the back-gate potential voltage (VBNP) to back-bias terminals of the p-type transistor and the n-type transistor;

calibrating a core supply voltage (VDD-VSS) by tuning the low core voltage supply (VSS) to a target frequency of a circuit delay monitor that is designed for sensitivity to an average delay of the p-type transistor and the n-type transistor; and calibrating the common back-gate potential (VBNP) to a target frequency ratio of at least two circuit delay monitors having different sensitivity to the average delay of the p-type transistor and the n-type transistor.

13. The method of claim 12, wherein the core circuitry is connected directly to the high core voltage supply (VDD), and wherein the core circuitry is connected directly to the DC-DC voltage regulation circuitry so as to receive the low core voltage supply (VSS) directly from the DC-DC voltage regulation circuitry.

14. The method of claim 12,
wherein the high core voltage supply (VDD) is equal to the externally supplied voltage (VBAT), and
wherein ground (GND) is defined as zero, and
wherein the low core voltage supply (VSS) is greater than the ground (GND), and
wherein the low core voltage supply (VSS) is between the externally supplied voltage (VBAT) and ground (GND).

15. The method of claim 12, wherein the p-type transistor comprises a p-type metal-oxide-semiconductor (PMOS) transistor and the n-type transistor comprises an n-type metal-oxide-semiconductor (NMOS) transistor.

16. The method of claim 12, wherein the p-type transistor and the n-type transistor are Silicon-On-Insulator (SOI) transistors having a default p-type back-gate to source potential VBS that is (VSS-VDD).

17. The method of claim 12, wherein the DC-DC voltage regulation circuitry operates to regulate the low core voltage supply (VSS) instead of the high core voltage supply (VDD).

18. A method for manufacturing an integrated circuit, the method comprising:
fabricating core circuitry with a high supply (VDD) and a low supply (VSS), wherein the high supply (VDD) is greater than the low supply (VSS), and wherein the low supply (VSS) is greater than ground (GND);
fabricating the core circuitry with multiple transistors including complementary transistors of a first polarity and a second polarity;
connecting a pin for the high supply (VDD) to an externally supplied voltage (VBAT) that is greater than a core supply voltage (VDD-VSS);
fabricating and connecting voltage regulation circuitry between the externally supplied voltage (VBAT) and ground (GND); and
fabricating the voltage regulating circuitry to generate the low supply (VSS) and a single control voltage (VBNP) to provide a common body bias for the multiple transistors having the first polarity and the second polarity, wherein the single control voltage (VBNP) is greater than ground (GND) such that (GND VBNP VDD), and wherein a difference between the single control voltage and the low supply (VBNP–VSS) is positive or negative.

19. The method of claim 18, wherein the multiple transistors are connected within a core area of the integrated circuit to form a logic and/or memory circuit design.

20. The method of claim 18,
wherein the voltage regulation circuitry comprises a DC-DC voltage regulation circuitry that operates to generate the low supply (VSS) instead of the high supply (VDD), and
wherein the high supply (VDD) is equal to the externally supplied positive voltage (VBAT), and
wherein ground (GND) is defined as zero, and wherein the low supply (VSS) is between the externally supplied positive voltage (VBAT) and ground (GND).

* * * * *